United States Patent
Desvaux et al.

(10) Patent No.: US 7,777,493 B2
(45) Date of Patent: Aug. 17, 2010

(54) METHOD FOR ADJUSTING AN EXCITATION AND DETECTION CIRCUIT FOR NUCLEAR MAGNETIC RESONANCE, AND CIRCUIT ADAPTED FOR CARRYING OUT SAID METHOD

(75) Inventors: Hervé Desvaux, Orsay (FR); Denis Marion, Pessac (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/048,562

(22) Filed: Mar. 14, 2008

(65) Prior Publication Data
US 2009/0140738 A1    Jun. 4, 2009

(30) Foreign Application Priority Data
Dec. 4, 2007    (FR) .................................... 07 08464

(51) Int. Cl.
*G01V 3/00*    (2006.01)
(52) U.S. Cl. ...................................... 324/322; 324/318
(58) Field of Classification Search ................. 324/322, 324/318
See application file for complete search history.

(56) References Cited

U.S. PATENT DOCUMENTS

| | | | | |
|---|---|---|---|---|
| 4,543,529 A | * | 9/1985 | Mee et al. ..................... | 324/313 |
| 4,633,181 A | * | 12/1986 | Murphy-Boesch et al. .. | 324/322 |
| 4,839,596 A | * | 6/1989 | Sugiura ....................... | 324/322 |
| 5,969,526 A | * | 10/1999 | Duerr .......................... | 324/318 |
| 6,107,798 A | * | 8/2000 | Hoult .......................... | 324/318 |
| 7,196,522 B2 | * | 3/2007 | Weiss et al. .................. | 324/322 |

OTHER PUBLICATIONS

Muller, Norbert and Alexej Jerschow; "Nuclear Spin Noise Imaging"; PNAS, vol. 103, No. 18, pp. 6790-6792, May 2, 2006.

Sklenar, Vladimir; Piotto, Martial; Leppik, Raymond; and Saudek, Vladimir; "Communications, Gradient-Tailored Water Suppression for $^1H$-$^{15}N$ HSQC Experiments Optimized to Retain Full Sensitivity"; Journal of Magnetic Resonance, Series A, 102, 242-245 (1993).

Gueron, Maurice; Plateau, Pierre; and Decorps, Michel; "Solvent Signal Suppression in NMR"; JPNMRS 23:2-A, pp. 135-209.

Sleator, Tycho and Hahn, Erwin L.; "Nuclear-Spin Noise and Spontaneous Emission"; The American Physical Society; Physical Review B; vol. 36, No. 4; Aug. 1, 1987, pp. 1969-1980.

(Continued)

*Primary Examiner*—Louis M Arana
(74) *Attorney, Agent, or Firm*—Alston & Bird LLP (57) ABSTRACT

A method of adjusting an excitation and detection circuit for nuclear magnetic resonance, the circuit comprising a probe (S) of the type comprising a single coil (L) for transmitting pulses to excite the nuclear spins of a sample immersed in a magnetic field and for detecting a resonance signal from said nuclear spins, said method being characterized by a step of tuning the resonant frequency in reception of said circuit to the Larmor frequency ($f_0$) of the nuclear spins of the atoms that are to be detected. An excitation and detection circuit for nuclear magnetic resonance, said circuit being characterized in that it is adapted to implement an adjustment method as described above.

20 Claims, 3 Drawing Sheets

OTHER PUBLICATIONS

McCoy, M.A. and Ernst, R.R.; "Nuclear Spin Noise At Room Temperature"; Chemical Physics Letters; vol. 159, No. 5, 6; Jul. 21, 1999; pp. 587-593.

Vlassenbroek, A.; Jeener, J.; and Broekaert, P.; "Radiation Damping in High Resolution Liquid NMR: A Simulation Study"; Chem Phys, 103 (14), Oct. 8, 1995, pp. 5886-5897.

Mao, Xi-An; Guo, Jian-Xin; and Ye, Chao-Hui; "Nuclear-Magnetic-Resonance Line-Shape Theory in the Presence of Radiation Damping"; The American Physical Society; Physical Review B; vol. 49, No. 22; Jun. 1, 1994, pp. 15 702-15 711.

Hoult, D.I.; The NMR Receiver: A Description and Analysis of Design; Progress in NMR Spectroscopy, 1978, vol. 12, pp. 41-77.

Gueron, M. et al., *NMR of Water Protons, the Detection of Their Nuclear-Spin Noise, and a Simple Determination of Absolute Probe Sensitivity Based on Radiation Damping*, Journal of Magnetic Resonance, Academic Press, Orlando, FL, vol. 85, No. 1, Oct. 1989, pp. 209-215.

Huang, S. Y. et al., *Sizable Concentration-Dependent Frequency Shifts in Solution NMR Using Sensitive Probes*, Journal of the American Chemical Society, vol. 126, No. 49, Dec. 2004, pp. 15936-15937.

Gueron, M., *A Coupled Resonator Model of the Detection of Nuclear Magnetic Resonance: Radiation Damping, Frequency Pushing, Spin Noise, and the Signal-to-Noise Ratio*, Magnetic Resonance in Medicine 1991 US, vol. 19, No. 1, 1991, pp. 31-41.

Mispleter, J. et al., *NMR Probeheads for Biophysical and Biomedical Experiments*, Imperial College Press, London, 2006, pp. 25-39; 47-53; 76-80.

Fukushima, E. et al., *Experimental Pulse NMR, A Nuts and Bolts Approach*, Addison-Wesley Publishing Company, USA, 1981, pp. 425-432.

Marion, D. J.-Y. et al., *An Alternative Tuning Approach to Enhance NMR Signals*, J. Magn. Reson., Journal of Magnetic Resonance, vol. 193, No. 1, Jul. 2008, pp. 153-157.

Search Report for European Patent Appl. No. EP 08 29 1122 completed Jan. 16, 2009.

* cited by examiner

METHOD FOR ADJUSTING AN EXCITATION AND DETECTION CIRCUIT FOR NUCLEAR MAGNETIC RESONANCE, AND CIRCUIT ADAPTED FOR CARRYING OUT SAID METHOD

CROSS REFERENCE TO RELATED APPLICATIONS

This application claims priority from French patent application 07 03723, filed May 25, 2007.

FIELD AND BACKGROUND OF THE INVENTION

The invention relates to a method of adjusting an excitation and detection circuit for nuclear magnetic resonance (NMR) serving to improve the signal-to-noise ratio of a signal detected by said circuit.

The invention also relates to an NMR excitation and detection circuit adapted to enable such a method to be implemented.

The invention applies to circuits including a probe of the type having a single coil for emitting a pulse for exciting the nuclear spins of a sample immersed in a magnetic field and for detecting a resonance signal from said nuclear spins. Such probes are used mainly in NMR spectroscopy, but sometimes also in nuclear magnetic resonance imaging (MRI).

Nuclear magnetic resonance or NMR is a method of performing precise chemical analysis of matter, but it suffers from a lack of sensitivity due to the small energies involved. Any method that makes it possible to increase this sensitivity will serve to extend the field of application of NMR and its best known branch MRI.

The principle of nuclear magnetic resonance by Fourier transform, which is the method that is presently the most sensitive and the most widespread, consists in placing the sample in an external static magnetic field $B_0$ and in exciting nuclear magnetization M by means of an electromagnetic pulse at radiofrequency of amplitude $B_1$ perpendicular to the static magnetic field $B_0$ and at a frequency that is close to the nuclear spin resonant frequency:

$$f_0 = \frac{|\gamma B_0|}{2\pi}$$

known as the Larmor frequency, where $\gamma$ is the gyromagnetic ratio.

It is important to observe that since the value of the static magnetic field $B_0$ in most experimental and commercial set-ups is constant, and since the gyromagnetic ratio of an isotope under consideration varies very little (relative variation less than $10^{-4}$ and typically about $10^{-5}$) depending on the chemical environment of its atom, that amounts to accepting that the Larmor frequency is a constant that is determined by the experimental setup.

After excitation, the nuclear magnetization describes a precession movement around the axis defined by $B_0$ at its Larmor frequency. This precession of the magnetization acts by the Faraday effect to create a current in a coil of axis perpendicular to $B_0$, which current corresponds to the signal that is actually detected. In practice, since the signal is weak, it is initially amplified before being multiplied by a reference frequency, typically that of the excitation radiofrequency (RF) field. By conserving only the low frequency portion of the signal (lowpass filter), the time-domain signal is subsequently converted digitally, and after applying a Fourier transform the spectrum is deduced therefrom. It can thus be seen that it is necessary to have beside the coil that creates the magnetic field $B_0$, at least one other coil that creates a radiofrequency field $B_1$ perpendicular to $B_0$. In most configurations, because of problems associated with space and crossing difficulties between the radiofrequency coils, it is found simpler to use only one radiofrequency coil, which coil is used both for excitation and for detection. That one coil is associated with capacitive elements so as to constitute a resonant circuit tuned to the Larmor frequency of the signal emitted by the nuclear spins of the atoms to be detected. An electronic circuit, often made of two diodes connected head to tail in parallel, placed between said resonant circuit and the preamplifier, serves to separate the transmission circuit from the reception circuit while protecting the reception circuit and in particular the preamplifier from voltage surges that are present during excitation [1]. At the coil, by tuning the resonant frequency $f_r$ of the resonant frequency containing the coil to the Larmor frequency $f_0$, an improvement is obtained in NMR detection sensitivity by a factor of $Q^{1/2}$ with:

$$Q = \frac{2\pi L f_r}{r}$$

where L is the inductance of the coil and r is its resistance. To do this, variable capacitors are added in series and in parallel. The electronic circuit comprising the coil and the tuning capacitors is referred to as a measurement head or "probe" and it constitutes the main portion of the excitation and detection circuit. It is also necessary to match impedance. That consists in matching the impedance of the probe to the impedance of the amplifier of the transmitter circuit, amongst other things, so that the power delivered thereby is not reflected. Matching is generally performed at 50 ohms ($\Omega$).

In practice, because of the high Larmor frequency associated with the static magnetic field, i.e. frequencies of several tens to several hundreds of megahertz, the tuning circuit of the probe is a reactive circuit which generally comprises a tuning capacitor represented by the value $C_t$ of its capacitance, generally connected in parallel with the coil, having the main purpose of adjusting the resonant frequency $f_r$ of the electronic circuit to the Larmor frequency $f_0$ of the nuclear spins of the atoms that are to be detected, and a matching capacitor represented by the value $C_m$ of its capacitance, generally connected in series with the parallel connection of the coil and the tuning capacitance $C_t$, for the purpose of matching the impedance of the probe to 50$\Omega$. The adjustment of the values of the adjustable capacitors, i.e. of the tuning capacitance $C_t$ and the matching capacitance $C_m$, which adjustment depends on the electrical losses in the sample, is generally determined experimentally either by studying the response of the resonant circuit containing the coil, which is done with the help of an LC balun circuit connected to a wobulator, or by minimizing the signal reflected to the amplifier. Under all circumstances, the resonant circuit of the probe is tuned in transmission to the Larmor frequency of the nuclear spins of the atoms to be detected.

Normally, it is considered that the tuning of the resonant circuit of the probe in transmission suffices to obtain satisfactory tuning of said resonant circuit in reception. In other words, it is considered that the resonant frequencies in transmission and in reception of the NMR probe are substantially the same.

However, the inventors have found that when the resonant frequency of the probe is accurately tuned in transmission to the Larmor frequency of the nuclear magnetization of the atoms for detection, the same probe is not accurately tuned in reception. This tuning offset is due to various factors, such as the length of cables, parasitic capacitances of diodes, etc. Contrary to the common opinion in the art of NMR spectroscopy, the inventors have realized that this tuning offset is far from being negligible, and can be evaluated as several tens or even several hundreds of kilohertz for most, if not all, NMR probes and commercial setups. Such a tuning offset gives rise to a drop in the power of the received signal and to a degradation in its signal-to-noise ratio that is of the order of 1 decibel (dB) or more, which is considerable.

SUMMARY OF THE INVENTION

An object of the invention is thus to provide a method of adjusting a probe for nuclear magnetic resonance, the probe being of the type comprising a single coil operating both in transmission and in reception, the method enabling the power of the detected resonance signal to be increased, thereby contributing to improving its signal-to-noise ratio.

In accordance with the invention, such an object is achieved by a method of adjusting an excitation and detection circuit for nuclear magnetic resonance, the circuit comprising a probe of the type comprising a single coil for transmitting pulses to excite the nuclear spins of a sample immersed in a magnetic field and for detecting a resonance signal from said nuclear spins, said method being characterized by a step of tuning the resonant frequency in reception of said circuit to the Larmor frequency of the nuclear spins of the atoms that are to be detected.

Tuning the resonant frequency in reception means adjusting the resonant frequency of the receiver circuit to the Larmor frequency. The receiver circuit comprises at least the probe and the means for adjusting its frequency and impedance. The frequency and impedance adjustment means are generally adjustable capacitors; nevertheless, any other type of adjustment means that does not degrade the quality factor (Q factor) of the coil by more than 10% can be suitable, for example reactive circuits.

Adjusting the resonant frequency of the receiver circuit on the Larmor frequency can be performed in the various ways described below.

In a first preferred variant, frequency adjustment in reception begins with an initial stage of tuning and impedance matching the probe in transmission, using the techniques of the prior art. In practice, a commonplace and reliable method consists in placing the sample for analysis in the probe and in generating a wobulated signal, either by delivering a suitable setpoint to the input of the generator of the NMR appliance, or by replacing said generator with a wobulator followed by an amplifier that delivers a signal at a level comparable with that of the generator. The response of the probe is then investigated via an LC balun circuit set relative to the impedance of the circuit for generating pulses for exciting nuclear spin. The resonant circuit of the probe is then adjusted so as to tune its resonant frequency to the Larmor frequency, and then its impedance is adapted to that of the generator of nuclear spin excitation pulses. Once this prior step has been performed, in order to tune the frequency in reception, transmission is stopped and the signal at the output from the preamplifier is observed by the nuclear magnetic resonance spectrometer. The frequency tuning means (generally a capacitor of capacitance $C_t$, and possibly with an iteration of using the capacitor of capacitance $C_m$ that adjusts impedance matching) is then lightly adjusted, so as to maximize the mean noise level at the Larmor frequency of the nuclear spins of the atoms for analysis.

When the resonant circuit containing the coil is very frequency selective, i.e. when the Q factor of the circuit is very great, it can happen that the small frequency offset induced by frequency tuning in reception gives rise to such a reduction in the power received by the sample during excitation that the power is no longer sufficient, or that the offset gives rise, because of the impedance mismatch at the Larmor frequency of the transmitter circuit, to non-operation of the generator of pulses for exciting the nuclear spins of the atoms for detection. That drawback is then remedied by adding second frequency adjustment means between the generator and the probe, e.g. means constituted by an adjustable capacitor or an adjustable reactive circuit.

In a second preferred variant of adjusting frequency in reception, frequency is adjusted in transmission by proceeding as above to tune and match the resonant circuit including the coil. The subsequent step of adjusting the resonant frequency of the circuit including the coil in reception then consists in measuring the frequency response of the signal output by the preamplifier, by accumulating and averaging a large number of acquisitions (typically more than 100) acquired with the help of a spectrum analyzer. A curve is obtained showing that the actual resonance of the receiver circuit differs a little from the Larmor frequency of the nuclear spins of the atoms for analysis. A first parameter of frequency adjustment means is then adjusted, generally by adjusting an adjustable capacitor connected so as to act on frequency, by modifying its capacitance until the actual resonance of the receiver circuit is equal to the Larmor frequency of the nuclear spins of the atoms for analysis.

In a third preferred variant, the frequency of the receiver is adjusted by performing adjustment that is even more accurate by making use of radiation damping. This third variant is described in greater detail below in the detailed description of the implementation.

In other particular implementations of the invention:
  said step of tuning the resonant frequency in reception of said probe to the Larmor frequency may include adjusting at least a first adjustment parameter and observing the effect of said adjustment on the electrical noise spectrum at the terminals of a resonant circuit including said coil, in the presence of a sample immersed in a magnetic field for analysis by nuclear magnetic resonance;
  said noise spectrum may be measured while adjusting at least said first adjustment parameter, said parameter being adjusted until the maximum of said noise spectrum coincides with said Larmor frequency;
  said noise spectrum may be measured by using an electronic spectrum analyzer;
  said step of tuning the resonant frequency in reception of said excitation and detection frequency to the Larmor frequency may comprise: using a nuclear magnetic resonance spectrometer to determine an offset between said Larmor frequency and the frequency at which said noise spectrum presents its intensity maximum; and tuning the excitation and detection circuit in transmission to the Larmor frequency modified by said offset;
  the sub-steps of determining said offset and tuning in transmission of said excitation and detection circuit may be repeated iteratively;
  said step of tuning the resonant frequency in reception of said probe to the Larmor frequency may comprise: measuring a spin noise spectrum; and adjusting at least said first adjustment parameter until said spin noise spectrum presents, at the resonant frequency, absorption having a Lorentzian line shape corresponding to pure absorption;

the tuning of the resonant frequency in reception of said excitation and detection circuit to the Larmor frequency of the nuclear spins of the atoms for detection may include simultaneous adjustment of at least first and second parameters, in order to optimize the Q factor of said probe at the same time as tuning its resonant frequency;

said first adjustment parameter may be the value of the capacitance of a first capacitor connected in parallel with said coil;

said second adjustment parameter may be the value of the capacitance of a second capacitor connected in series with the parallel connection of said coil and said first capacitor;

the method may also include a step of adjusting at least a third adjustment parameter in order to obtain an impedance match between the excitation and detection circuit and a circuit for generating said nuclear spin excitation pulse, said third parameter being selected so as to avoid affecting, at least to a first approximation, the tuning of the resonant frequency in reception of said excitation and detection circuit;

the method may also include a step of adjusting at least a fourth adjustment parameter, to obtain tuning in transmission of the excitation and detection circuit on the Larmor frequency, said fourth parameter being selected so as to avoid affecting, at least to a first approximation, the tuning of the resonant frequency in reception of said excitation and detection circuit;

the steps of adapting the impedance of the excitation and detection circuit to that of the circuit for generating said nuclear spin excitation pulse, and tuning in transmission to the Larmor frequency, may be performed by adjusting at least one adjustable electrical element situated on a transmission line connecting a resonant circuit including said coil to a circuit for generating said nuclear spin excitation pulse, said adjustable electrical element being separated from said resonant circuit including the coil by a decoupling element that is seen as an open circuit by the spin resonance signal detected by said coil;

in a variant, the frequency tuning in reception of said excitation and detection circuit may be performed by adjusting at least one adjustable element situated at the input of a preamplifier circuit for amplifying a spin resonance signal received by said coil, said adjustable electrical element being separated from said coil by a decoupling element seen as a short circuit to circuit ground by the nuclear spin excitation pulses;

the steps of matching the impedance of the excitation and detection circuit to that of a circuit for generating said nuclear spin excitation pulse, and of tuning in transmission to the Larmor frequency, may be performed by adjusting the capacitance values of first and second capacitors disposed respectively in parallel with said coil and in series with the parallel connection of said coil and said first capacitor; and said steps of tuning the frequency of said probe in reception and of matching its impedance and tuning its frequency in transmission may be repeated iteratively.

The invention also provides an excitation and detection circuit for nuclear magnetic resonance, the circuit including a probe of the type comprising a single coil transmitting pulses for exciting the nuclear spins of a sample immersed in a magnetic field and for detecting a resonant signal from said nuclear spins, said circuit being characterized in that it is adapted to implement an adjustment method as described above and in that it includes: at least one adjustable electrical element for enabling the resonant frequency in reception of said probe to be tuned to the Larmor frequency of the nuclear spins of the atoms to be detected; and at least one adjustable electrical element enabling the resonant frequency in transmission of said probe to be tuned to the Larmor frequency of the nuclear spins of the atoms to be detected, and enabling the impedance thereof to be matched to that of a circuit for generating said nuclear spin excitation pulse.

In particular embodiments of the invention:

at least one said adjustable electrical element may be situated on a transmission line connecting said coil to a circuit for generating said nuclear spin excitation pulse, said reactive element being separated from the coil by a decoupling element seen as an open circuit by the spin resonance signal detected by said coil; and in a variant, at least one said adjustable electrical element may be situated at the input of a preamplifier circuit for amplifying a spin resonance signal received by said coil and separated from said coil by a decoupling element seen as a short circuit to circuit ground by the nuclear spin excitation pulse.

BRIEF DESCRIPTION OF THE DRAWINGS

Other characteristics, details, and advantages of the invention appear on reading the description made with reference to the accompanying drawings given by way of example, and in which.

DETAILED DESCRIPTION

Figures 1, 1B:
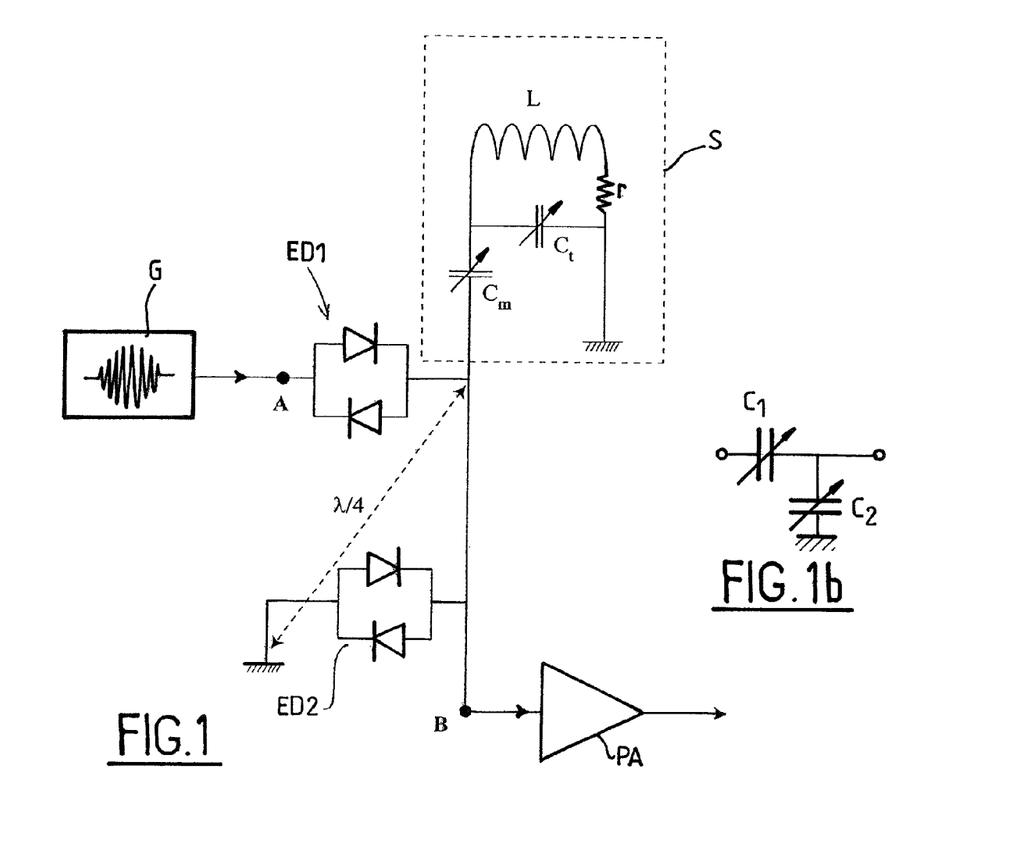
FIG. 1 is a theoretical circuit diagram of an NMR excitation and detection circuit including a probe of the type having a single coil operating both in transmission and in reception.
FIG. 1b shows a frequency tuning and impedance matching circuit for the probe in transmission.

FIG. 1 is a theoretical circuit diagram of the electronic circuit of the probe S of an NMR spectrometer. Such a probe is known in the prior art, and in particular from document [1].

The excitation coil, represented by an inductance L connected in series with a resistance r serves to create an excitation RF field, and to detect the nuclear magnetic resonance signal. Adjustable capacitors of variable capacitance $C_t$ (in parallel) and $C_m$ (in series) co-operate with said coil to form a resonant circuit. The resonant frequency of the circuit depends mainly on the tuning capacitance $C_t$, while its impedance is determined essentially by the matching capacitance $C_m$. It is thus possible to adjust those two parameters independently (in fact, an adjustment of $C_t$ also modifies impedance, and likewise $C_m$ has an effect on the resonant frequency; consequently, adjustment is generally performed iteratively).

The probe S is connected via transmission lines to a circuit G for generating RF pulses for exciting nuclear spins, and to a preamplifier PA for amplifying the weak resonance signal detected by the coil of the probe. It is important that the very intense excitation pulse does not reach the input of the preamplifier PA, and that the weak resonance signal is not dispersed on the line from the generator G. Separation between the transmission circuit and the reception circuit is provided by two decoupling elements ED1 connected in series with the generator G, and ED2 connected in parallel with the input of the preamplifier PA. Each of the two decoupling elements ED1, ED2 is constituted by a set of two diodes connected head to tail in parallel. These diodes appear as short circuits for signals that are very intense (such as the excitation pulse) and as open circuits for signals that are weak (such as the detected resonance signal).

The distance between the outlet from the decoupling element ED1 (coil side) to electrical ground via ED2 is equal to one-fourth of the wavelength ($\lambda/4$) at the Larmor frequency of the nuclear spins.

A first implementation of the method for adjusting the probe S is described below with reference to FIGS. 3A and 3B. These figures show the spectrum of the electrical noise voltage at the terminals of a cryoprobe TCI amplified by the preamplifier PA, in the presence of a reference sample of ethyl-benzene in 0.1% deuterium chloroform immersed in a magnetic field $B_0$ of 16.5 teslas (T); the spectra were acquired by means of an E4411B analyzer from Agilent Technologies. To acquire these noise spectra, a rapid succession of acquisitions without prior excitation pulses was programmed on the spectrometer, and the signal from the preamplifier was detected directly by the spectrum analyzer.

Figure 3A:
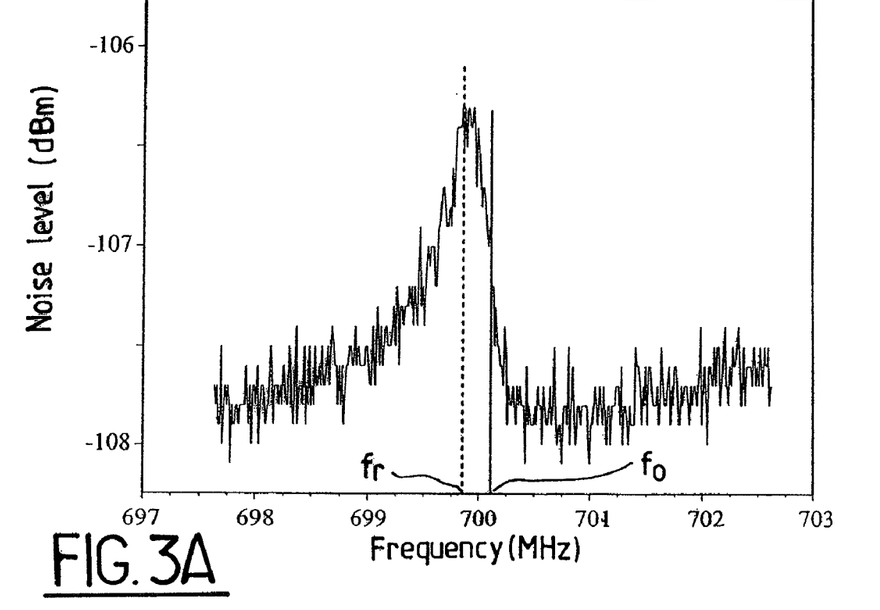
FIGS. 3A and 3B show two electrical noise spectra at the terminals of an NMR probe tuned in transmission (FIG. 3A) and in reception (FIG. 3B) showing the tuning frequency difference between transmission and reception.

FIG. 3A corresponds to the probe S being tuned in transmission to the Larmor frequency for the sample in the field $B_0$, $f_0$=700.13 megahertz (MHz). Since the frequency and impedance adjustment means are adjustable capacitors of capacitances $C_t$ and $C_m$, tuning was obtained by adjusting them to a value determined by means of the response observed while using the wobulator function of the spectrometer in association with an LC balun circuit. A similar spectrum was obtained by adjusting the same capacitances to values determined using an external LC balun circuit and an external wobulator, or to values determined by minimizing reflections between the probe and the generator.

In this figure, it can be seen that the maximum of the noise spectrum, which is situated at the detection resonant frequency of the resonant circuit of the probe, $f_r$=699.8 MHz, is offset by 330 kilohertz (kHz) from the Larmor frequency of the protons of the sample in the field $B_0$: $f_0$=700.13 MHz.

An adjustment method of the invention comprises adjusting the values of $C_t$ and $C_m$ until the maximum of the noise spectrum coincides with the Larmor frequency $f_0$=700.13 MHz. In principle, frequency tuning could be obtained by acting solely on the tuning capacitance $C_t$, but that would degrade the Q factor of the circuit. By acting on both capacitances simultaneously, using the above-mentioned iterative procedure, it is possible to tune the frequency of the probe S while simultaneously optimizing its Q factor.

Figure 3B:
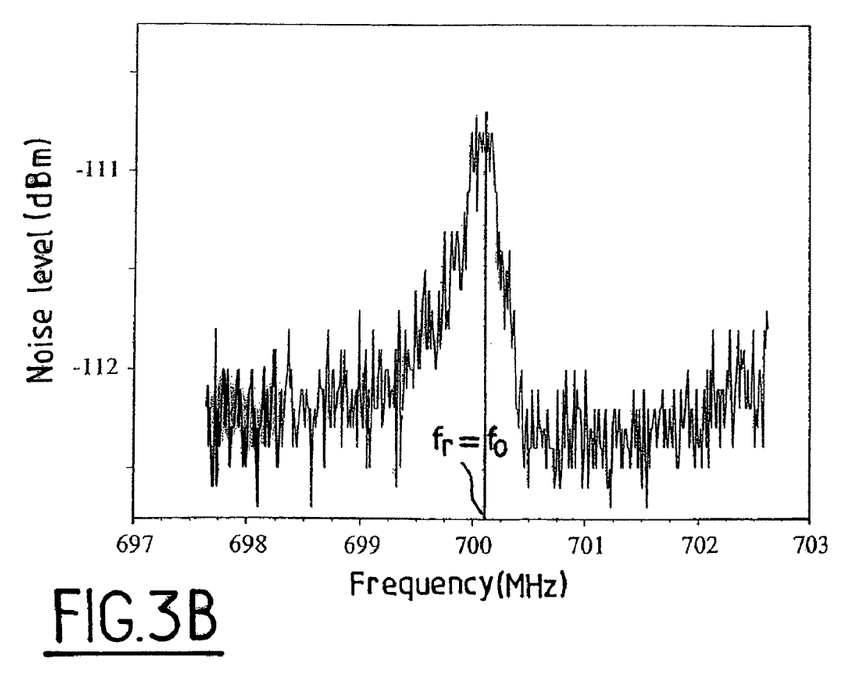

The curve of FIG. 3B shows the result after such a manipulation. It can be seen that the frequency of the reception maximum coincides with the resonant frequency of the protons in said field (700.13 MHz). Comparing noise levels in these two figures for a tuning mismatch of 330 kHz shows that using a probe adjusted in accordance with the invention enables the level of the NMR signal to be increased by about 1.1 dB, i.e. by more than 25%.

This first implementation of the adjustment method of the invention presents the advantage of being simple and quick, since noise spectrum acquisition can be performed almost in real time. Its limitation lies in the fact that merely connecting a spectrum analyzer to the output of the preamplifier PA alters the resonant frequency of the reception circuit as a whole by a small amount. The tuning obtained in this way therefore cannot be perfect.

A second implementation of the invention makes it possible to overcome that limitation by using the NMR spectrometer itself as the means for acquiring the noise spectrum.

Initially, the power spectrum is acquired using the same sequence as above over a broad passband (typically several hundreds of kilohertz), and using the NMR spectrometer as the acquisition system. Over this passband, the frequency is determined for which noise is at a maximum. Thereafter, using a method of adjusting the resonant frequency of the probe in transmission (wobulator or reflection analyzer), the values of the capacitances $C_m$ and $C_t$ are optimized so as to shift the resonant frequency of the probe by the observed offset. In other words, the values of these capacitances are adjusted "blind" by dichotomy, since acquiring the noise spectrum by means of the NMR spectrometer is presently too slow to enable adjustment to be performed in "real time" as when using a spectrum analyzer.

To refine the adjustment, it is therefore appropriate to iterate the procedure.

A third implementation of the method, enabling even more accurate tuning of the resonant circuit of the probe to be achieved is based on a coherent damping effect known as "radiation damping". The description of this third implementation is therefore preceded by an explanation of this effect.

Figure 2A:
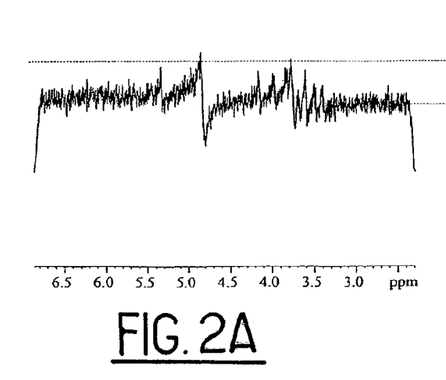
FIGS. 2A and 2B show two examples of spin noise NMR spectra. The spectrum of FIG. 2A was acquired using a probe tuned in transmission, i.e. in accordance with the prior art, while the spectrum of FIG. 2B was acquired using a probe tuned in reception, in accordance with the invention.

The precession of the magnetization of the nuclear spins in the sample acts by induction to create a current in the coil of the probe; specifically, it is the voltage associated with this current that constitutes the detected NMR signal. The current flowing in the coil of the probe in turn creates a magnetic field at the Larmor frequency. This field feeds back on the magnetization and has the effect of producing a "couple" that tends to cause the magnetization to return along the static field [2]. This is radiation damping. The magnitude of this phenomenon is characterized by the time:

$$\tau_{RD} = \frac{2}{\mu_0 \eta Q \gamma M}$$

where $\mu_0$ is the magnetic permeability of a vacuum and $\eta$ is the filling factor of the coil. The direction of this radiofrequency field forms an angle:

$$\psi = a\tan\left(\frac{f_r^2 f_0}{Q f_r (f_r^2 - f_0^2)}\right)$$

with the transverse magnetization direction that is accurately in quadrature when the resonant frequency of the circuit is equal to the Larmor frequency. Depending on the magnetization, the radiation damping phenomenon, which is associated with non-linear response phenomena, becomes large at high frequencies for concentrated samples and when the probe used presents a very good Q factor. These conditions are encountered more and more frequently because of the improvement in the techniques for fabricating probes and magnets. The consequences of this phenomenon on the spectrum are numerous, and mention can be made of spectrum lines broadening for small excitation angles, and the presence of oscillations in the spectrum for excitation angles greater than 90° [3]. A phase difference of other than 90° between the feedback field and the magnetization (i.e. where $f_r$ is not equal to $f_0$) gives rise via the Fourier transform, to the resonant spectrum line of a signal presenting radiation damping effects being no longer symmetrical in shape about the frequency for which the intensity is at a maximum. Such an asymmetrical spectrum line is no longer purely absorptive (FIG. 2B) but also presents a dispersive component (FIG. 2A). For a given tuning frequency offset, this effect becomes more marked with increasing Q factor of the coil; as a general rule, probes for nuclear magnetic resonance are characterized by Q factors that are large.

The preferred method of detecting nuclear magnetic resonance is the method based on the Fourier transform of the signal acquired in the time domain after excitation of the nuclear magnetization by a radiofrequency pulse. The spectrum can also be obtained by the so-called "spin noise" method when the concentration of substance is sufficient for the radiation damping effect to appear, e.g. by affecting spectrum line width [4]. In that method, starting from a system of nuclear spins in thermodynamic equilibrium and placed in a magnetic field $B_0$, no excitation is applied, the time-domain signal merely being recorded and the power spectra calculated and then summed. By adding such spectra, it is found that the noise level is lowered at the resonant frequencies of the magnetizations that present a radiation damping effect: the nuclear spin system absorbs the coil noise at those frequencies and the spectrum is thus deduced therefrom. A physical description of this phenomenon presents numerous analogies with the emission process [5]. Under such conditions, if the detection electronic circuit is tuned to the Larmor frequency, absorption notches are observed around a mean noise signal, the absorption notches presenting a Lorentzian line shape corresponding to the resonances of the nuclear spins. When $f_r$ is not equal to $f_0$ then the observed signal is a mixture of the portions in absorption and in dispersion of a Lorentzian line shape [4].

It is this point that makes it possible to take advantage of the radiation damping phenomenon for tuning the resonant frequency in reception of the probe to the Larmor frequency.

FIG. 2A shows an example of spin noise NMR spectra obtained on a sample containing 0.7 grams (g) of saccharose in 500 microliters (μL) of $D_2O$ with a Bruker NMR spectrometer at 700 MHz fitted with a cryoprobe tuned in transmission, in accordance with the prior art. The asymmetrical shape of the spectrum shows that in reception the probe is not tuned to the Larmor frequency. Physically, what happens is the radio noise tends to interact with the nuclear magnetization, creating an oscillating system. Since the tuning of the receiver circuit on the Larmor frequency of the spectrum line under consideration is not precise, the energy due to noise excites nuclear magnetization at the Larmor frequency, and the response is thus modified by the resonant modification of the tuning circuit, which is different.

Figure 2B:
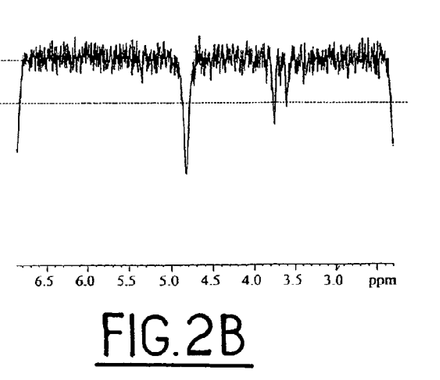

In accordance with the third implementation of the method of the invention, the values of the capacitances $C_t$ and $C_m$ of the adjustable capacitors are adjusted until said spectrum presents a pure absorption peak, as shown in FIG. 2B. What is then happening is the energy due to noise excites the nuclear magnetization at its Larmor frequency, and its response is resonantly sustained by the oscillating electronic circuit, giving a single spectrum line that is clear, of large amplitude, and symmetrical.

In FIG. 2, there can be seen the highest mean noise level (mean value of the base line represented by the dotted line making simplified display possible), that results from better tuning in reception and signals in absorption. Adjusting the values of the capacitances $C_t$ and $C_m$ of the adjustable capacitors can be performed so as to maximize the mean noise level, instead of (or as well as) observing the shape of the absorption peak, in accordance with the above description of the second implementation.

While adjusting the probe, the tuned frequency in transmission goes from 700.13 MHz for FIG. 2A to 700.49 MHz for FIG. 2B.

To obtain these spectra, 700 0.32 second (s) acquisitions were recorded, each comprising 2048 complex points, and the power spectra were calculated. Since both spectra were acquired and reproduced under the same conditions, it can also be seen that the noise level is decreased at the margins as a result of the physical filtering present in the acquisition scheme and the Fourier transform of the spectrometer that was used.

Compared with the prior art, the two advantages of adjusting the NMR probe so that its resonant frequency in reception corresponds to the nuclear spin Larmor frequency of the atoms that are to be detected are as follows.

If the sample is such that radiation damping effects are present, this tuning ensures that the radiation damping RF field is exactly in phase quadrature with the nuclear magnetization (signal phasing), thereby leading to a resonant spectrum line that is symmetrical. The tuning of this resonant frequency characteristic of the invention is then performed by adjusting at least a first parameter of the probe in such a manner that the signal which initially appears in the form of a mixture of the absorptive and dispersive portions of the same Lorentzian line shape, which can thus be considered as being phase-shifted as shown in FIG. 2A, adopts after adjustment the Lorentzian line shape for pure absorption, i.e. phased as shown in FIG. 2B.

Once this adjustment specific to the invention has been performed, it becomes easier to eliminate a residual peak of the solvent, e.g. water, by techniques that are themselves known [6, 7].

The spin noise spectra are likewise thus obtained in pure absorption, making their applications such as spin noise imaging more sensitive [8].

It can be observed that when looking at FIGS. 2A and 2B not from the point of view of signal waveform, but from the point of view of signal mean level, this reduces to the second implementation of the invention. It is then appropriate to perform the adjustment in such a manner as to obtain the extreme value for said mean value (as represented by a dotted horizontal line). Since the figure shows a signal power level (necessarily positive), this extreme value corresponds to the maximum value for the amplitude of this mean value (dotted horizontal line) on causing the adjustable element to vary.

More generally, and more advantageously, the fact of the detection circuit being tuned on the spin Larmor frequency ensures that no portion of the weak NMR signal is lost by reflection between the probe and the analog-to-digital converter. This gives rise to an increase in the signal that can also be associated with an improvement in the Q factor of the coil at the working frequency, specifically the Larmor frequency.

Figure 4A:
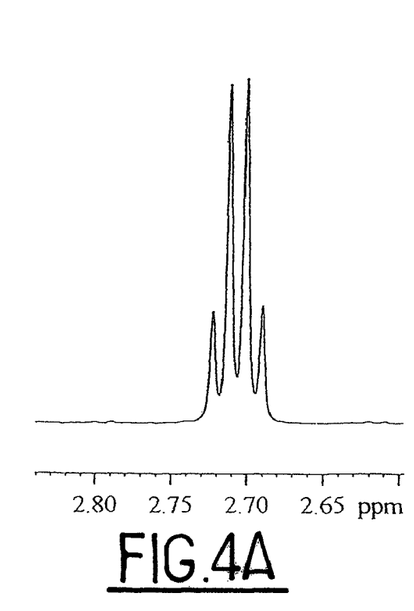
FIGS. 4A and 4B show a portion of the NMR spectrum corresponding to the protons of the $CH_2$ of an ethyl group. The spectrum was acquired using an NMR probe tuned in transmission (FIG. 4A) and using the same probe tuned in reception (FIG. 4B), thereby showing the gain in terms of signal intensity that can be obtained by means of the invention.
Figure 4B:
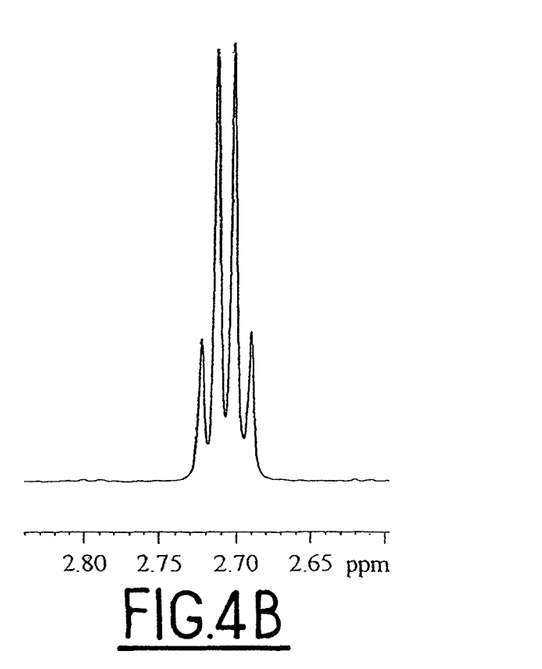

This result is illustrated by comparing FIGS. 4A and 4B which show a portion of the spectrum of an 0.02% ethylbenzene sample in 500 μL of deuterium chloroform ($CDCl_3$), with the portion corresponding to the CH$_2$ quadruplet in the ethyl group being shown. Those figures show spectra corresponding to simple acquisition after a 90° pulse, as performed on a Bruker Advance II spectrometer operating at 700 MHz and fitted with a TCI cryoprobe.

The spectrum 4A was obtained by adjusting the values of the capacitances C$_m$ and C$_t$ of the adjustable capacitors so as to tune the probe in transmission to the Larmor frequency f$_0$=700.13 MHz. The spectrum 4B was obtained by adjusting the values of the capacitances C$_m$ and C$_t$ so as to tune the probe in reception; under such conditions, the resonant frequency in transmission was 700.33 MHz.

A comparison of the intensities of the signals (I$_B$–I$_A$)/I$_A$ shows an improvement of 28% (31.5% for a comparison of integrals) when tuning is in reception.

Figure 5:
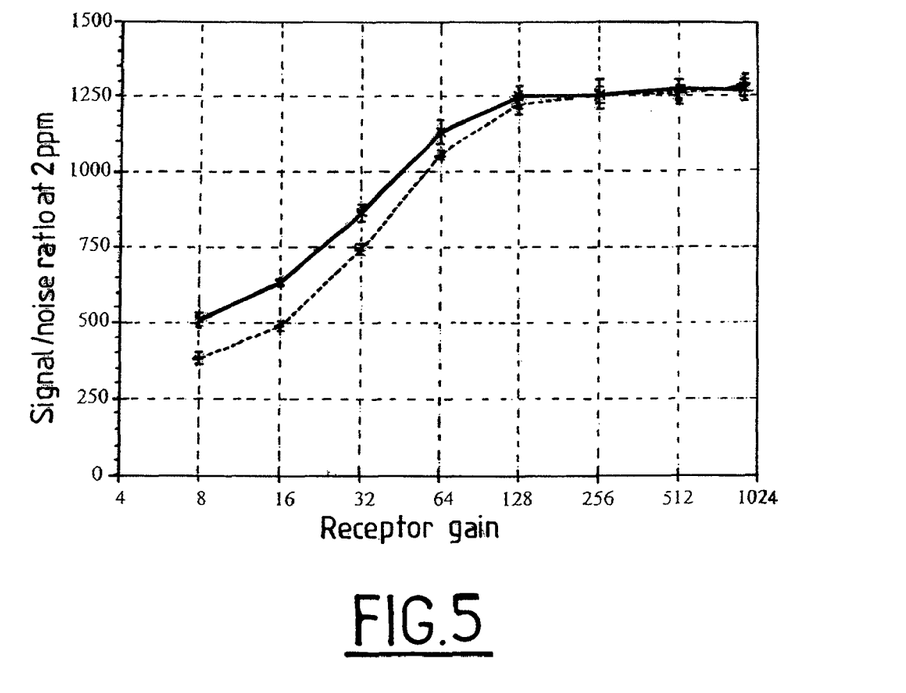
FIG. 5 shows the improvement in the signal-to-noise ratio that can be obtained by implementing the invention.

This improvement in the signal, that is valid in all circumstances, can also give rise to an improvement in the signal-to-noise ratio. By way of example, the curves of FIG. 5 show mean values of the signal-to-noise ratio as a function of receiver gain level for a probe tuned in reception in accordance with the invention (continuous line) and for an identical probe tuned in transmission in accordance with the prior art (dashed line). Each signal-to-noise ratio value corresponds to a mean taken over the best values measured on five to ten different spectra. Noise was calculated over a range of 2 parts per million (ppm) and the signal was calculated from the resonance level of the CH$_2$ group of ethyl-benzene.

Similar curves have been obtained using other probes, other spectrometers, and samples that are more concentrated, from which improvements in signal-to-noise ratio have been observed down to the smallest receiver gain levels; the amount of improvement depends on the system under consideration. It can clearly be seen that an improvement of about 30% is obtained for all gain values below 128. The two curves, corresponding to tuning in transmission and in reception, end up saturating on the same value; it is thus particularly advantageous to implement the invention when it is necessary to operate at a gain level that is relatively low. This saturation value is associated with the origin of the noise, which for these receiver gain values is dominated by probe noise and optimizing the preamplifier as a function of said probe noise. In particular, it can be seen that even if signal gain is always present as a result of adjusting the tuning of the probe for reception purposes, the signal-to-noise ratio is always at least the same and can be greater. This approach is particularly advantageous in the usual circumstances where an intense signal, e.g. associated with the solvent or a buffer, coexists with a sample of interest that is at low concentration.

The fact of tuning the NMR probe in reception is thus advantageous from the point of view of the intensity of the detected resonance signal and from the point of view its signal-to-noise ratio. Nevertheless, when the probe is tuned in reception, it is necessarily not tuned in transmission. Furthermore, the input impedance of the probe as seen by the generator G is no longer equal to 50Ω.

This frequency offset, and this impedance mismatch lengthen the duration of the excitation pulse ("90°" pulse) and cause a portion of its power to be reflected. By way of example, in FIGS. 4A and 4B, the duration of the 90° pulse, measured by searching for the 360° pulse goes from 6.35 microseconds (μs) to 7.1 μs. This lengthening can be a handicap when using certain pulse sequences, in particular sequences that include high power decoupling or recoupling pulse trains. This is representative of the fact that a portion of the power transmitted by the generator G is reflected back thereto and can then disturb or even prevent proper operation thereof.

It should be observed that impedance matching in reception between the probe S and the preamplifier PA is not generally necessary, and sometimes is deliberately avoided.

To mitigate the difficulty associated with the tuning offset and impedance mismatch of the probe in transmission, it is proposed to add between the first decoupling element ED1 and the pulse generator G (position A in FIG. 1) an adjustable electrical element enabling probe frequency to be tuned and impedance to be matched in transmission with the pulse generator connected to the probe, but without that disturbing the frequency tuning in the reception as obtained in accordance with the invention. Such an adjustable element may be an electrical or electronic circuit based on variable inductances and/or capacitances, and/or on fast switches; by way of example, a simple electrokinetic calculation indicates that a circuit made up of two variable capacitances, one in series (C$_1$) and the other in parallel (C$_2$) with the probe, placed at point A, can make it possible to achieve tuning both in transmission and in reception (see FIG. 1*b*). In a variant, this adjustable element may be constituted by a transmission line (a cable) of variable length connecting the point A to the generator circuit G.

In conclusion, the procedure is as follows.

Initially, the values of the capacitances C$_t$ and C$_m$ of the adjustable capacitors are adjusted so as to tune the probe in reception while optimizing its Q factor.

As a consequence, this leads to a frequency offset and an impedance mismatch of the transmission circuit. While keeping the values of the capacitances C$_t$ and C$_m$ of the adjustable capacitors constant, it is possible for example to use a bidirectional coaxial coupler to measure the voltage transmitted relative to the voltage reflected, thus giving an indication of the frequency tuning and the impedance matching of the transmission circuit.

Then, where necessary, action is taken on an impedance-matching adjustable electrical element connected to point A, or on the length of cable connecting the pulse generator G to the probe S, to match and tune the probe in transmission. This impedance-matching adjustable element may be a variable capacitor or a reactive circuit, or any other circuit that gives rise to a modification in the frequency response and the impedance response of the electronic circuit. During testing, modulating the length of the cable enables the reflection ratio of excitation pulses to be reduced by 75% and enables their duration to be taken from 7.1 μs to 6.65 μs (to be compared with a duration of 6.35 μs when the probe is tuned solely in transmission in accordance with the prior art).

These impedance matching operations performed on the transmission line do not influence the improvement in sensitivity, as is confirmed by comparing the signal-to-noise ratios. This comparison continues to show that adjustment in reception is more sensitive than adjustment in transmission, as in the prior art. Nevertheless, it is possible to further refine the adjustment by proceeding in iterative manner.

Another variant of the invention consists in providing an adjustable electrical element for tuning and matching between the second decoupling element ED2 and the preamplifier PA (position B in FIG. 1). As above, the adjustable electrical element may be constituted by a reactive circuit (e.g. comprising the two capacitors C$_1$ and C$_2$ of FIG. 1*b*) and/or by a transmission line of variable length and/or by any other circuit modifying the frequency response of the receiver electronic circuit.

Under such circumstances, the adjustable electrical element placed at point B is used for tuning the probe in reception, while the adjustable capacitors of capacitances $C_t$ and $C_m$ situated close to the coil serve to tune and match it in transmission.

The solutions may be combined, by providing tuning and matching circuits both at point A and at point B.

REFERENCES

[1] D. I. Hoult, The NMR receiver: a description and analysis of design. Prog. NMR Spectrosc. 12 (1978) 41-77.
[2] A. Vlassenbroek, J. Jeener, and P. Broekaert, Radiation damping in high resolution liquid NMR: a simulation study. J. Chem. Phys. 103 (1995) 5886-5897.
[3] X. A. Mao, J. X. Guo, and C. H. Ye, Nuclear magnetic resonance line-shape theory in the presence of radiation damping. Phys. Rev. B 49 (1994) 15702-15711.
[4] M. A. McCoy and R. R. Ernst, Nuclear spin noise at room temperature. Chem. Phys. Lett. 159 (1989) 587-593.
[5] T. Sleator, E. L. Hahn, C. Hilbert, and J. Clarke, Nuclear-spin noise and spontaneous emission. Phys. Rev. B 36 (1987) 1969-1980.
[6] M. Guéron, P. Plateau, and M. Decorps, Solvent signal suppression in NMR. Prog. NMR Spectrosc. 23 (1991) 135-209.
[7] V. Sklenar, M. Piotto, R. Leppik, and V. Saudek, Gradient-tailored water suppression for H-1-N-15 HSQC experiments optimized to retain full sensitivity. J. Magn. Reson. 102 (1993) 241-245.
[8] N. Müller and A. Jerschow, Nuclear spin noise imaging. Proc. Natl. Acad. Sci. USA 103 (2006) 6790-6782.

The invention claimed is:

1. A method of adjusting an excitation and detection circuit for nuclear magnetic resonance, the circuit comprising a probe of the type comprising a single coil for transmitting pulses to excite the nuclear spins of a sample immersed in a magnetic field and for detecting a resonance signal from said nuclear spins, the circuit also comprising a first capacitor connected in parallel to said coil and a second capacitor connected in series with the parallel connection of said coil and said first capacitor, said method comprising a step of adjusting capacity values of said first and second capacitor in order to simultaneously tuning the resonant frequency in reception of said circuit to the Larmor frequency ($f_0$) of the nuclear spins of the atoms that are to be detected and optimizing a Q factor of said probe.

2. A method according to claim 1, in which the tuning of the resonant frequency in reception of said excitation and detection circuit to the Larmor frequency of the nuclear spins of the atoms for detection includes simultaneous adjustment of at least first and second parameters ($C_t$, $C_m$), in order to optimize the Q factor of said probe at the same time as tuning its resonant frequency.

3. A method according to claim 2, in which said first adjustment parameter is the value of the capacitance of a first capacitor connected in parallel with said coil.

4. A method according to claim 3, in which said second adjustment parameter is the value of the capacitance of a second capacitor connected in series with the parallel connection of said coil and said first capacitor.

5. A method according to claim 1, also including a step of adjusting at least a third adjustment parameter in order to obtain an impedance match between the excitation and detection circuit and a circuit for generating said nuclear spin excitation pulse, said third parameter being selected so as to avoid affecting, at least to a first approximation, the tuning of the resonant frequency in reception of said excitation and detection circuit.

6. A method according to claim 5, also including a step of adjusting at least a fourth adjustment parameter, to obtain tuning in transmission of the excitation and detection circuit on the Larmor frequency, said fourth parameter being selected so as to avoid affecting, at least to a first approximation, the tuning of the resonant frequency in reception of said excitation and detection circuit.

7. A method according to claim 5, in which the steps of adapting the impedance of the excitation and detection circuit to that of the circuit for generating said nuclear spin excitation pulse, and of tuning in transmission to the Larmor frequency, are performed by adjusting at least one adjustable electrical element situated on a transmission line connecting a resonant circuit including said coil to a circuit for generating said nuclear spin excitation pulse, said adjustable electrical element being separated from said resonant circuit including the coil by a decoupling element that is seen as an open circuit by the spin resonance signal detected by said coil.

8. A method according to claim 5, in which the frequency tuning in reception of said excitation and detection circuit is performed by adjusting at least one adjustable element situated at the input of a preamplifier circuit for amplifying a spin resonance signal received by said coil, said adjustable electrical element being separated from said coil by a decoupling element seen as a short circuit to circuit ground by the nuclear spin excitation pulses.

9. A method according to claim 8, in which the steps of matching the impedance of the excitation and detection circuit to that of a circuit for generating said nuclear spin excitation pulse, and of tuning in transmission to the Larmor frequency, are performed by adjusting the capacitance values of first and second capacitors disposed respectively in parallel with said coil and in series with the parallel connection of said coil and said first capacitor.

10. A method according to claim 5, in which said steps of tuning the frequency of said probe in reception and of matching its impedance and of tuning its frequency in transmission are repeated iteratively.

11. A method of adjusting an excitation and detection circuit for nuclear magnetic resonance, the circuit comprising a probe of the type comprising a single coil for transmitting pulses to excite the nuclear spins of a sample immersed in a magnetic field and for detecting a resonance signal from said nuclear spins, said method comprising a step of tuning the resonant frequency in reception of said circuit to the Larmor frequency ($f_0$) of the nuclear spins of the atoms that are to be detected, in which said step of tuning the resonant frequency in reception of said probe to the Larmor frequency includes adjusting at least a first adjustment parameter and observing the effect of said adjustment on the electrical noise spectrum at the terminals of a resonant circuit including said coil, in the presence of a sample immersed in a magnetic field for analysis by nuclear magnetic resonance.

12. A method according to claim 11, in which said noise spectrum is measured while adjusting at least said first adjustment parameter, said parameter being adjusted until the maximum of said noise spectrum coincides with said Larmor frequency ($f_0$).

13. A method according to claim 12, in which said noise spectrum is measured by using an electronic spectrum analyzer.

14. A method according to claim 11, in which said step of tuning the resonant frequency in reception of said excitation and detection frequency to the Larmor frequency comprises:

using a nuclear magnetic resonance spectrometer to determine an offset between said Larmor frequency ($f_0$) and the frequency ($f_r$) at which said noise spectrum presents its intensity maximum; and tuning the excitation and detection circuit in transmission to the Larmor frequency modified by said offset.

15. A method according to claim 14, in which the sub-steps of determining said offset and tuning in transmission of said excitation and detection circuit are repeated iteratively.

16. A method according to claim 11, in which said step of tuning the resonant frequency in reception of said probe to the Larmor frequency comprises:

measuring a spin noise spectrum; and adjusting at least said first adjustment parameter until said spin noise spectrum presents a pure absorption peak.

17. A method according to claim 11, in which the tuning of the resonant frequency in reception of said excitation and detection circuit to the Larmor frequency of the nuclear spins of the atoms for detection includes simultaneous adjustment of at least first and second parameters ($C_t$, $C_m$), in order to optimize the Q factor of said probe at the same time as tuning its resonant frequency.

18. An excitation and detection circuit for nuclear magnetic resonance, the circuit including a probe of the type comprising a single coil transmitting pulses for exciting the nuclear spins of a sample immersed in a magnetic field and for detecting a resonant signal from said nuclear spins, said circuit including:

at least one adjustable electrical element operable for enabling the resonant frequency, when said probe is operating in reception, to be tuned to the Larmor frequency ($f_0$) of the nuclear spins of the atoms to be detected; and at least one adjustable electrical element enabling the resonant frequency in transmission of said probe to be tuned to the Larmor frequency ($f_0$) of the nuclear spins of the atoms to be detected, and enabling the impedance thereof to be matched to that of a circuit for generating said nuclear spin excitation pulse.

19. An excitation and detection circuit for nuclear magnetic resonance according to claim 18, in which at least one said adjustable electrical element is situated on a transmission line connecting said coil to a circuit for generating said nuclear spin excitation pulse, said reactive element being separated from the coil by a decoupling element seen as an open circuit by the spin resonance signal detected by said coil.

20. An excitation and detection circuit for nuclear magnetic resonance according to claim 18, in which at least one said adjustable electrical element is situated at the input of a preamplifier circuit for amplifying a spin resonance signal received by said coil and separated from said coil by a decoupling element seen as a short circuit to circuit ground by the nuclear spin excitation pulse.

* * * * *

UNITED STATES PATENT AND TRADEMARK OFFICE
CERTIFICATE OF CORRECTION

PATENT NO. : 7,777,493 B2  Page 1 of 1
APPLICATION NO. : 12/048562
DATED : August 17, 2010
INVENTOR(S) : Desvaux et al.

It is certified that error appears in the above-identified patent and that said Letters Patent is hereby corrected as shown below:

Column 1,

Lines 10 and 11, "This application claims priority from French patent application 07 03723, filed May 25, 2007." should read --This application claims priority from French patent application 07/08464, filed Dec. 4, 2007.--.

Signed and Sealed this
Twenty-first Day of February, 2012

David J. Kappos
*Director of the United States Patent and Trademark Office*